United States Patent [19]

Sommer et al.

[11] 4,281,336
[45] Jul. 28, 1981

[54] THYRISTOR ELEMENT WITH SHORT TURN-OFF TIME AND METHOD FOR PRODUCING SUCH ELEMENT

[75] Inventors: Karlheinz Sommer; Alois Sonntag, both of Warstein, Fed. Rep. of Germany

[73] Assignee: Licentia Patent-Verwaltungs-G.m.b.H., Frankfurt am Main, Fed. Rep. of Germany

[21] Appl. No.: 146,401

[22] Filed: May 5, 1980

[30] Foreign Application Priority Data

May 3, 1979 [DE] Fed. Rep. of Germany ....... 2917786

[51] Int. Cl.³ .............................................. H01L 29/74
[52] U.S. Cl. ........................................ 357/38; 357/64; 357/86
[58] Field of Search ............................... 357/38, 64, 86

[56] References Cited

U.S. PATENT DOCUMENTS

| 3,943,549 | 3/1976 | Jaecklin et al. | 357/38 |
| 4,165,517 | 8/1979 | Temple et al. | 357/38 |
| 4,214,254 | 7/1980 | Kimura et al. | 357/64 |

FOREIGN PATENT DOCUMENTS

| 1489087 | 4/1971 | Fed. Rep. of Germany . | |
| 2461207 | 6/1976 | Fed. Rep. of Germany | 357/38 |

Primary Examiner—Joseph E. Clawson, Jr.
Attorney, Agent, or Firm—Spencer & Kaye

[57] ABSTRACT

A fast switching thyristor having a shorted emitter structure in which, in order to shorten the turn-off time, the charge carrier lifetime is set to be low by means of recombination centers. The charge carrier lifetime in at least the control base zone of the thyristor is set initially to be homogeneous and low corresponding to a desired firing resistance underneath the emitter zone with respect to the voltage rise of the returning forward voltage in the thyristor after every recovery process, and the charge carrier lifetime is set to be low compared to the homogeneous setting in the partial region of the control base zone extending from below the control electrode substantially to the portion of the edge of the emitter zone which faces the control electrode but without contacting the edge of the emitter zone. If the thyristor is of the amplifying gate type having a shorted auxiliary emitter structure, then the charge carrier lifetime in the region between the main and auxiliary emitter zones is less than the charge carrier lifetime in the region between the auxiliary emitter zone and control electrode which in turn is less than the homogeneously set charge carrier lifetime in the bulk or volume of the device. Additionally, the density of the shorting channels in the edge region of the auxiliary emitter zone facing the control electrode is greater than in the remainder of this zone and than in the main emitter zone.

6 Claims, 4 Drawing Figures

THYRISTOR ELEMENT WITH SHORT TURN-OFF TIME AND METHOD FOR PRODUCING SUCH ELEMENT

BACKGROUND OF THE INVENTION

The present invention relates to fast switching thyristors in which the charge carrier lifetime is set to be short by means of recombination centers in order to shorten the turn-off time, and which have a zone structure including an emitter zone and a control base zone, with the emitter zone being penetrated by shorting channels which emanate from the control base zone. More particularly, the present invention relates to such a fast switching thyristor in which the charge carrier life-time is set to be homogeneous and low, corresponding to a desired firing resistance below the emitter zone with respect to the rise in the returning forward voltage across the thyristor after every turn-off process, and in which, in partial regions, the charge carrier lifetime is set to be low compared to the homogeneously set charge carrier lifetime. The invention further relates to a thyristor having a so-called amplifying gate as well as a method for producing such fast switching thyristors.

German Auslegeschrift (Published Patent Application) No. 1,489,087, published Sept. 3, 1970, discloses a semiconductor device, for example a so-called thyristor disc, having an improved frequency behavior and exhibiting the structural features mentioned in the first sentence except for the shorting channels in the emitter zone, as well as a method for producing such a semiconductor device.

In order to obtain improved frequency behavior, the turn-off time in the known device is likewise shortened by lowering the carrier lifetime in such a manner that within its volume or bulk through which current passes, there are disposed mutually separated regions or a grid-like interconnected region containing recombination centers in greater concentration than in the adjacent volume or bulk of the emitter zone and the control base zone. The increased number of recombination centers in this region or regions is formed by diffusion of, e.g., gold atoms, or by the influence, of radiation on the thyristor disc through a mask applied to one major surface of the element.

The regions of reduced carrier lifetime are to be effective only to a shallow depth below the n emitter zone and must, as is stated explicitly, not influence the two operationally effective pn-junctions between the p base zone and the n base zone and between the n base zone and the p emitter zone, respectively, i.e., at that depth no local reduction of the carrier lifetime is to be effected.

Moreover, German Offenlegungsschrift (application published without examination) No. 2,402,205, published Jan. 17th, 1974, discloses a method for reducing the turn-off time of a thyristor also having the above-mentioned structural features but again without shorting channels in the emitter zone. According to this method, the operational and ready-to-be connected thyristor element is subjected at one of its major surfaces to an orthogonally directed electron radiation of an energy greater than 1 MeV without masking. This reduces the charge carrier lifetime in the volume or bulk of the thyristor element spatially almost homogeneously and not, as explained above, in a localized distribution.

When an irradiation dosage in the order of magnitude of $10^{14}$ electrons/cm$^2$ is employed, this results in a noticeable reduction of the turn-off time which, however, is connected with a marked increase in the forward voltage drop.

Finally, United States Patent Application Ser. No. 86,579, filed Oct. 19th, 1979 by Alois Sonntag et al, and assigned to the same assignee as the present application, discloses fast switching thyristors with shorted emitter structures, including those with amplifying gate structures, wherein a marked reduction of the turn-off time is realized, but without increasing the forward voltage drop, the firing current or the turn-on losses, by reducing the charge carrier lifetime in the thyristor in a localized distribution. In particular, the charge carrier lifetime beneath the emitter zone is set to be homogeneous and low, corresponding to a desired firing resistance beneath the emitter zone with respect to the rise in the returning forward voltage across the thyristor after every turn-off process, and in sharply delineated closed small regions arranged along the edge of the emitter zone facing the control electrode and intersected by the edge of the emitter zone, the charge carrier lifetime is set to be low compared to the homogeneous setting.

SUMMARY OF THE INVENTION

It is the object of the invention to provide another arrangement for realizing a marked reduction of the turn-off time in a thyristor element by reducing the charge carrier lifetime in a localized distribution but without increasing the forward voltage drop.

It is a further object of the invention to provide a further arrangement for accomplishing the reduction in the turn-off time of a thyristor without increasing the firing current and, in particular, without increasing the turn-on losses.

The above object is achieved according to one embodiment of the invention in a thyristor having a shorted emitter structure and in which the charge carrier lifetime in at least the control base zone is set to be homogeneous and low, corresponding to a desired firing resistance below the emitter zone with respect to the voltage rise of the returing forward voltage across the thyristor after each turn-off process, by even further lowering the charge carrier lifetime in the partial region of at least the control base zone of the semiconductor body which extends from beneath the edge of control electrode substantially to the portion of the pn-junction between the emitter zone and the control base zone which faces the control electrode, i.e., the portion of the edge of the emitter zone which faces the control electrode, but without contacting the edge of the emitter zone.

Thyristors are available on the market which have, for example, a centrally disposed control electrode and shorting channels in the emitter zone, but which do not exhibit the remaining structural features of the invention. The shorting channels of such known thyristors are arranged to be closer together in an area of the emitter zone adjacent its edge facing the control electrode than in the internal or remaining area of the emitter zone (so-called increased or close edge shorting). This increased edge shorting provides, with a given charge carrier lifetime in the control base zone, a greater firing resistance with respect to the rise rate of the returning forward voltage across the thyristor element.

On the other hand, however, the measure of increased edge shorting produces, as already mentioned above, a further increase in the control or firing current since the emitter shorting resistance becomes lower. Moreover, this measure has a negative influence on the permissible current rise rate of the thyristor and brings about higher turn-on losses.

The advantages of the above-mentioned zone structure according to the invention, i.e., the localized variation of the charge carrier lifetime in the control base zone are that in a thyristor element having shorting channels in the emitter zone, an increase in the control or firing current is prevented, but the increase in the insensitivity against turn-on by forward recovery current during the rise of the returning voltage is not limited as a result of the increased edge shorting. However, in such a zone structure, an increase in the control or firing current can be prevented only with up to a limited number of small regions.

The above-described problem is solved in a thyristor element having a zone structure including a main emitter zone as well as an auxiliary emitter zone and a control base zone, i.e., in so-called amplifying gate thyristors, where both emitter zones are penetrated by shorting channels, and wherein the charge carrier lifetime in at least the control base zone of the thyristor is set to be homogeneous and low, corresponding to a desired firing resistance underneath the emitter zone with respect to the increase in the returning forward voltage in the thyristor element after each recovery process, in that the charge carrier lifetime is set to be low compared to the homogeneously set charge carrier lifetime in a first partial region of the control base zone which extends from below the edge of the control electrode substantially to the pn-junction between the auxiliary emitter zone and the control base zone and, in particular, to the portion of the pn-junction, i.e., the edge of the auxiliary emitter zone, facing the control electrode, but without contacting the edge of the auxiliary emitter zone, in that the charge carrier lifetime is set to be low compared to that of said first partial region in a second partial region of the control base zone which extends from the region below the edge of the auxiliary emitter electrode substantially to the pn-junction between the main emitter zone and the control base zone and, in particular, to the portion of this pn-junction, i.e., the edge of the main emitter zone, facing the auxiliary emitter zone, but without contacting the edge of the main emitter zone, and in that the shorting channels in the auxiliary emitter zone are arranged closer together in the region adjacent the edge, or part of the edge, facing the control electrode than in the inner region of the auxiliary emitter zone and closer than in the main emitter zone.

According to a feature of the invention, the first and second partial regions of the thyristor extend to a distance of 0.05 mm to 0.3 mm, preferably 0.1 mm, from the edge of the auxiliary emitter zone or from the edge of the emitter zone, respectively.

In the amplifying gate type of the thyristor according to the invention, the so-called increased edge shorting of the main emitter zone is moved into the auxiliary emitter zone. Thus, the increased firing resistance of the thyristor is retained and an increase in the firing and control current can be prevented in this way without limits. At every firing process, firing takes place initially through the auxiliary emitter of the auxiliary thyristor system with normal control current, i.e., without increased requirements for control current. The anode current of the so-called thyristor is here not taken from a control generator which as such is provided to supply the control current for the actual thyristor, but from the current source which furnishes the anode current.

To set a short carrier lifetime in a disc or wafer-shaped thyristor element having the features according to the invention, a method is used which will be described briefly below. A thyristor that has been provided with contact layers serving as electrodes and is ready to be connected, is subjected at one of its major surfaces to an electron radiation at an energy higher than 1 MeV directed orthogonally to that major surface. The electron radiation is applied in spatially sharply delineated bundles of rays which are directed onto parts of the major surface of the partial regions and act with an irradiation dosage of $5 \cdot 10^{13}$ to $5 \cdot 10^{14}$ electrons/cm$^2$. The irradiation with electrons in sharply defined bundles of rays is preceded by a diffusion with gold or platinum through one major surface into the thyristor which has not yet been provided with the contact layers which serve as electrodes.

This method corresponds generally to the method disclosed in the above-mentioned United States Patent Application Ser. No. 86,579 for setting a low charge carrier lifetime in sharply defined, closed small regions of a thyristor element.

BRIEF DESCRIPTION OF THE PREFERRED EMBODIMENTS

Figure 1:
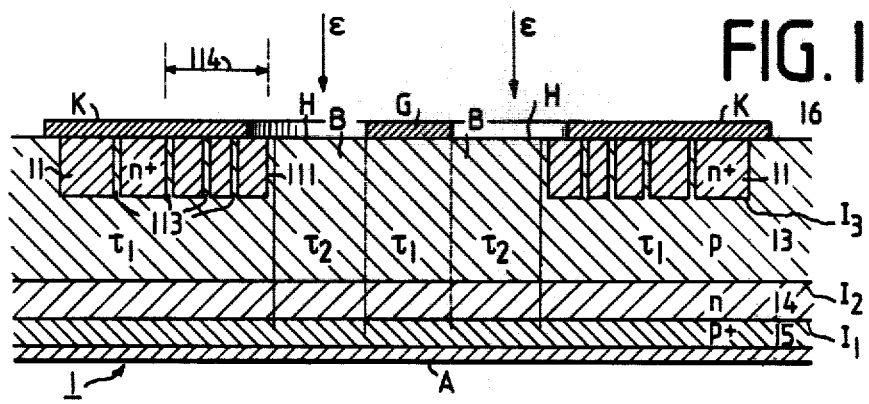
FIG. 1 is a diametrical cross-sectional view through a thyristor according to the invention having a central control electrode and an annular emitter zone.
Figure 2:
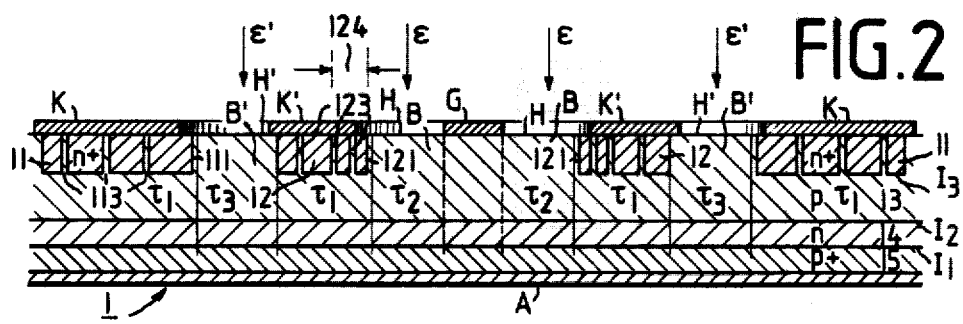
FIG. 2 is a diametrical cross-sectional view through a thyristor according to the invention having a central control electrode and an annular emitter zone as well as an annular auxiliary emitter zone disposed within the control base zone.
Figure 3:
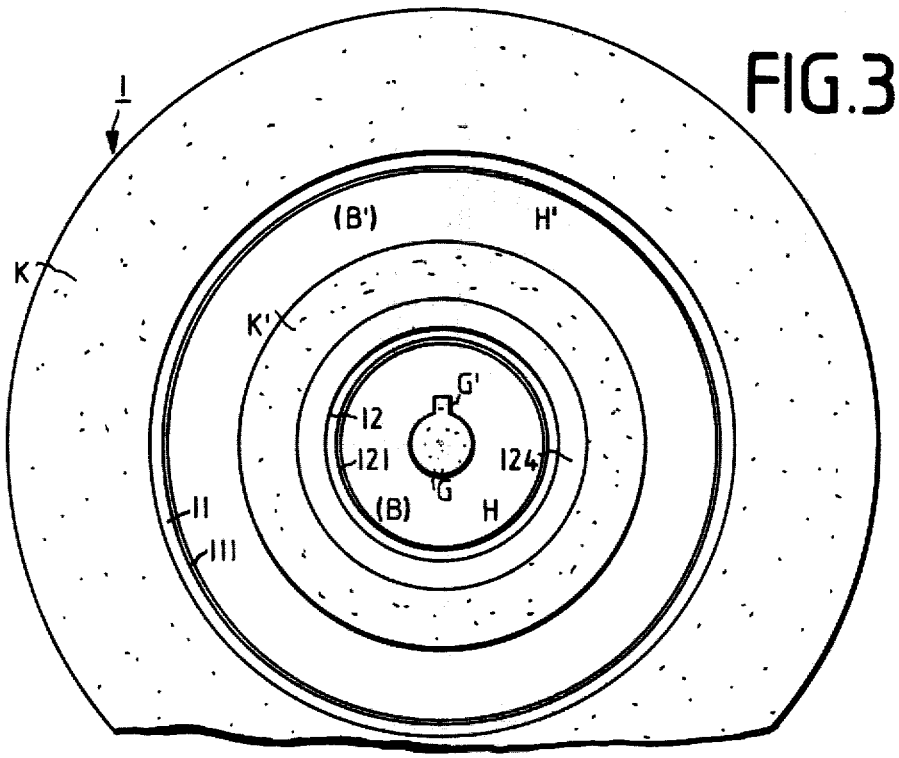
FIG. 3 shows the thyristor of FIG. 2 in a plan view of the cathode-side major surface.

In FIGS. 1 to 3, the same elements are marked by the same reference numerals.

Referring now to FIG. 1, there is shown a semiconductor body formed, e.g, of monocrystalline silicon, and having four zones of alternating opposite conductivity types. In particular, the semiconductor body 1 includes an n+ type conductivity annular emitter zone 11, a p-type conductivity control base zone 13, a n-type conductivity zone 14 and a p+ type conductivity counter emitter zone 15. As shown, the four zones 11, 13, 14 and 15 are arranged such that the zones 14 and 15 form a pn-junction $J_1$, the zones 13 and 14 form a pn-junction $J_2$ and the zones 11 and 13 form a pn-junction $J_3$. The annular emitter zone 11 is formed within the control base zone 13 adjacent the major surface 16 so that both the emitter zone 11 and the control base zone 13 extend to this major surface 16. Moreover, the emitter zone 11 is penetrated by a plurality of shorting channels 113 emanating from the control base zone 13. These shorting channels 113 are of p-type conductivity and extend to the major surface 16.

Disposed on the major surface 16 of the semiconductor body or wafer 1 is a centrally disposed gate or control contact or electrode G for the control base zone 13 and an annular cathode or emitter contact or electrode K which contacts the emitter zone 11 and the shorting channels 13 to provide the so-called shorted emitter structure. The other major surface of the wafer 1, the surface of zone 15, is provided with an anode contact or electrode A.

Figure 4:
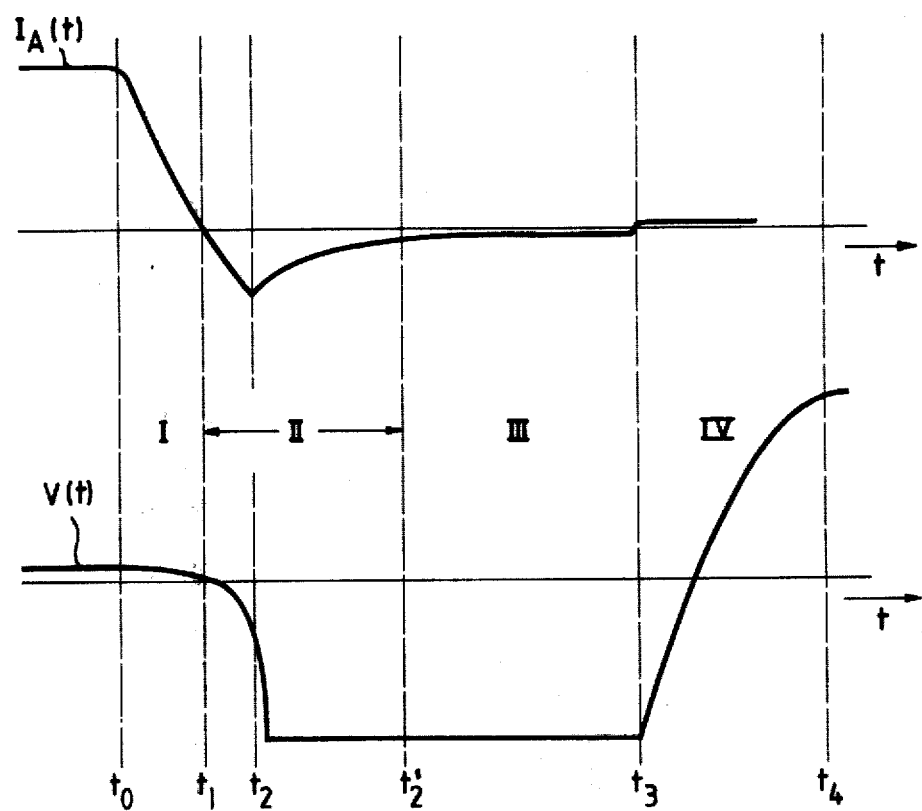
FIG. 4 is a time diagram showing the anode current and voltage of a thyristor during the turn-off phase.

Briefly, in a thyristor, the turn-off time is defined as the period of time of the transition from the conductive state in the forward direction to the blocking state in the forward direction, i.e., forward voltage, which period of time, the so-called turn-off phase, is sub-divided into four time periods. The physical and electrical occurrences during these four time periods are described in detail in the above-mentioned United States Patent Application Ser. No. 86,579. The four time periods are called the commutation phase, the extraction-recombination phase, the recombination phase and the phase in which the anode voltage returns with a positive dV/dt. In the order listed, they are identified as periods I, II, III and IV and are shown generally in FIG. 4.

The turn-off time $t_q$ of the thyristor is determined essentially by the length of time periods II and III from $t_1$ to $t_3$, i.e., $$t_q = t_{II} + t_{III}.$$

For $t_{II}$ and $t_{III}$ relationships apply with $N_{II}$ (carrier concentration in time period II) and $N_{III}$ (carrier concentration in time period III). That is, $$t_{II} = T_a \cdot \ln \frac{N_{II}}{N_{III}}$$

$$t_{III} = T_{hl} \cdot \ln \frac{N_{III}}{N_z}$$

where
$T_a$ = is the decay constant of the charge carrier density
$T_{hl}$ = charge carrier lifetime with high carrier density
$N_z$ = permissible charge carrier density at $t_{III}$ This shows that there exist essentially two possibilities for reducing $t_q$; namely (1) by reducing $T_{hl}$, which reduces $t_{II}$ only slightly, but $t_{III}$ noticeably, or (2) by taking measures that the permissible carrier concentration $N_z$ in base zones 13 and 14 may be still high when the forward voltage with rising dV/dt returns so that $t_{III}$ is reduced. Of these possibilities, the reduction of $T_{hl}$ has been practiced so far, but resulted in an increase of the forward voltage drop $V_T$.

In order to be able to use the second possibility, the permissible concentration $N_z$ of flooding charge carriers must be high; during the rise of the returning voltage dV/dt, the thyristor must be able to carry a correspondingly high "forward recovery current pulse" without firing. This is known to be possible with partially effective emitter shorts. The example of insensitivity against turn-on by forward recovery current shows, however, that the use of the second possibility for reducing the turn-off time $t_q$ also brings about problems with respect to the setting of or even the maintenance of further favorable thyristor properties which will also be considered below after first considering the turn-on by forward recovery current.

The effectiveness of the above-mentioned emitter shorts can be defined by the reciprocal of the "specific emitter short resistance" according to the relationship $$\frac{V_m}{I_s} = \rho_{sh}$$

in which $I_s$ is the current density of a homogeneously distributed imaginary forward current pulse which appears as an increased blocking current pulse and which is dissipated through the emitter shorts, i.e., channels 113 of emitter zone 11 in FIG. 1; and $V_m$ is the maximum value of an increase in potential in a region uniformly occupied by emitter shorts which is produced as a result of the lateral currents in the p-base zone 13. When the occupation is not uniform, the maximum $V_m$ value should also be used.

Unintentional firing of a thyristor occurs whenever, during the rise of the returning voltage dV/dt, there occurs a forward current pulse, or if, for example, at the end of time period III (FIG. 4) there occurs a positive so-called recovery current pulse and a potential $V_m$ is thus generated which at 25° C. is greater than 0.5 to 0.7 V or at 125° C. is greater than 0.35 to 0.4 V.

If the specific emitter short resistance $\rho_{sh}$ is to be made low so that a remaining high charge carrier concentration $N_z$, as explained above, is permissible, the shorting channels 113 in the emitter zone 11, particularly in the edge region 114 of the emitter zone 11 which faces the control electrode G, must be arranged to be very close to one another. For fast thyristors which are switched with frequencies in the kilohertz range, such so-called increased or close shorting is not of advantage, and has drawbacks, particularly in the vicinity of the control electrode.

If a forward voltage is applied across the zone structure of the thyristor 1 of FIG. 1 when it is in the blocking state, a space charge zone will form parallel to the pn-junction $J_2$ between the base zones 13 and 14 causing a capacitive shifting current $I_c$ to flow as hole current to the cathode emitter zone 11 and as a corresponding electron current to the anode zone 15. The magnitude of the shifting current depends on the returning voltage rise rate of the voltage present across the pn-junction $J_2$ according to the relationship:

$$I_c = C \cdot dV/dt.$$

If now the density of the shorting channels 113 of the emitter zone 11 (shorting density) and thus the resistance in the shorting channels is selected in such a manner that all holes flowing in the p base zone (control base zone 13) as capacitive shifting current $I_c$ toward the n emitter zone 11 flow out through the shorting channels 113, but the voltage required for this or the potential $V_m$, respectively, remains below 0.5 to 0.7 V at 25° C. or below 0.4 V at 125° C., no injection of electrons will take place from the n+ emitter zone 11 into the p control base zone 13.

Below the area surrounding the control electrode G in FIG. 1, there develops during the build-up of the space charge zone a hole current flowing toward the inner edge 111 of the annular emitter zone 11 and therefore again a higher hole concentration than in the inner emitter zone area, which with a sufficiently high remaining concentration $N_z$ effects firing of the thyristor when the voltage returns with the given dV/dt. To prevent an injection of electrons at the inner edge 111 of the n+ emitter zone 11, the above-mentioned remaining concentration $N_z$ must be reduced, i.e., the time period $t_{III}$ of the recombination phase must be extended or the density of the shorting channels 113 must be increased even more in an area along the inner edge 111 of the emitter zone 11.

An increase in this shorting density of emitter zone 11 to the extent that all holes flowing to the edge region 114 as capacitive shifting current can flow off through the shorting channels 113 is an additional drawback since then, conversely, all holes flow off through the shorting channels 117 when a firing current is impressed. Thus, the firing current required becomes undesirably large.

If a relatively large portion of the area of the inner edge region 114 of the emitter zone 11 is occupied with shorting channels 113, firing can occur only in spots and the firing propagation rate will then be lower than with few shorting channels 113. High turn-on losses result therefrom because during the first microseconds of turn-on, the current conducting area becomes small and the current density with a given current rise dI/dt becomes correspondingly large. For thyristors switching at frequencies in higher frequency ranges such turn-on losses are a particular drawback.

The drawbacks due to a high density of the shorting channels 113 in the area along the edge 111 of the emitter zone 11 can be avoided and the turn-off time can nevertheless be reduced with a high carrier density $N_z$ in the p base zone 13 of the thyristor 1 of FIG. 1, if only in the partial region B extending from below at least the edge of the control electrode G to the pn-junction $J_3$ between the emitter zone 11 and the control base zone 13, i.e., the edge 111 of emitter zone 11 facing the control electrode G, but without contacting the edge 111 of the emitter zone 11, there are present irradiation defect centers in addition to the atomic recombination centers, such as for example, homogeneously distributed gold atoms which are present in the entire thyristor 1, so that in in the partial region B the charge carrier lifetime $\tau_2$ is set considerably lower throughout base zones 13 and 14 than the charge carrier lifetime which has been set by means of gold atoms to be homogeneous and low in the adjacent portions of the thyristor 1 (so-called local reduction of the charge carrier lifetime $\tau$). The small region of the control base zone 13, remaining between the edge 111 of the emitter zone and the region B, is in the range of from 0.05 mm to 0.3 mm and preferably 0.1 mm.

As a result of this lower carrier charge lifetime $\tau_2$ in partial region B, the recombination rate is high. Consequently, during the recombination phase II the carrier density is reduced faster in the partial region B than in the remaining volume of bulk of the thyristor. At the end of phase III, when the permissible remaining charge carrier density $N_z$ is still relatively high in the partial region remote from the control electrode G, it has been reduced in the vicinity of the control electrode G to the extent that the capacitive displacement current concentrating at the emitter edge 111 can no longer cause the thyristor to fire. The above-explained drawbacks of a high density of shorting channels 113 in the region of the edge 111 of the emitter zone 11 are thus avoided. Moreover, this measure of the so-called local reduction of $\tau$, has the result that the forward voltage drop $V_T$ will not increase since no anode current $I_A$ flows through the surface portions H of region B.

The so-called local reduction of $\tau$, as described above, can be realized with respect to the method employed by means of electron irradiation of the thyristor element 1 at the cathode side major surface 16 and can be performed with sharply defined radiation bundles $\epsilon$ which are oriented orthogonally onto the surface portions H of the region B after the contacts or electrodes K and G have been applied. In the remainder of the base zones 13 and 14, however, the charge carrier lifetime $\tau_1$ can be set to a desired value by means of an Au diffusion over the whole area of surface 16 prior to the electron irradiation and prior to the application of the contacts K and G.

As mentioned above, by using the measure of local low-setting of the charge carrier lifetime $\tau$, it is possible to set the turn-off time to the desired value with any given arrangement and density of the shorting channels 113 without increasing the forward voltage drop in the thyristor and without incurring losses at higher switching frequencies as a result of increased current density in the region of the emitter zone edge 111.

The measure of local low-setting of the charge carrier lifetime $\tau$ in the region B is also limited if the thyristor is required to have a high firing sensitivity. The firing condition for a thyristor results from the relationship $$I_A = \frac{I_{co} + A_1 \cdot I_z}{1 - (A_1 + A_2)}$$

where $I_A$ is the anode current of the forward conducting thyristor;

$I_{co}$ is the hole or electron current, respectively, flowing out of the space charge zone at the pn-junction $J_2$;

$A_1$ is the current amplification factor of the n+pn transistor portion of the thyristor;

$A_2$ is the current amplification factor of the pnp transistor portion of the thyristor;

$I_z$ is the control current required for firing (firing current requirement).

With the reduction of the charge carrier lifetime $\tau$ in region B, the factors $A_1$ and $A_2$ become smaller. $I_{co}$ and/or $I_s$ must then become larger so that the thyristor can fire again and the anode current $I_A$ becomes greater than the so-called latching or holding current of the thyristor. However, an increase in the charge carrier current $I_{co}$ requires a greater voltage across the pn-junction $J_2$ so that the anode-cathode voltage required to fire the thyristor becomes greater which may often be undesirable.

If now the firing capability of the thyristor which has been inhibited due to the locally low-set charge carrier lifetime $\tau$ in the region B is compensated only be means of a corresponding increase in the control or firing current, respectively, firing currents of 1 to 2 A are required if the charge carrier lifetime $\tau$ in the edge region 114 of the emitter zone 11 is set so low that no firing of the thyristor is possible here during the turn-off process. However, thyristors with short turn-off times in which the requirement for firing current is high are as rarely acceptable for many thyristor applications, as users can do without thyristors having a short turn-off time. The measure of local low setting of the charge carrier lifetime $\tau$ in thyristors can also be used in a so-called amplifying gate thyristor 1' according to FIGS. 2 and 3.

The thyristor 1' of FIGS. 2 and 3 generally differs from the thyristor 1 of FIG. 1 in that it has an n+ conductivity type auxiliary emitter zone 12 formed in the control base zone 13 between the locus of the gate electrode G and the main emitter zone 11 and likewise extending to the major surface 16. The auxiliary emitter zone 12 is likewise provided with shorting channels 123 and a contact or electrode K' disposed on the surface 16.

Furthermore, in the auxiliary emitter zone 12 the shorting channels 123 are arranged to be narrower and closer together in the region 124 of the edge 121 of the zone 12 which faces the control electrode G than in the inner or remaining region of the auxiliary emitter zone 12. In contradistinction thereto, and in contradistinction to the embodiment of FIG. 1, the emitter zone 11 is penetrated by few, uniformly spaced shorting channels 113 so that the above-explained potential $V_m$ with a given voltage rise dV/dt is less than the voltage required to inject electrons from the n+ emitter zone 11.

As indicated in FIG. 2, the amplifying gate thyristor 1' according to the invention, has three different settings $\tau_1$, $\tau_2$, and $\tau_3$ for different regions of the base zones 13 and 14. In the regions B and B', lying between the control electrode G and the auxiliary emitter zone 12 and between the auxiliary emitter zone 12 and the emitter zone 11, respectively, atomic recombination centers, e.g., gold, as well as irradiation defect centers are present in a uniform distribution, whereas, in the remainder of the thyristor 1', and in particular the remainder of the base zones 13 and 14, only atomic recombination centers are present. As with the embodiment of FIG. 1, the regions B and B' extend to within 0.05 mm and 0.3 mm, and preferably 0.1 mm of the associated emitter zone edge 121 or 111, respectively.

In order to produce the thyristor 1' of FIG. 2, initially, by means of the diffusion of gold atoms through the major surface 16 of the thyristor 1' prior to application of the electrodes G, K and K', the charge carrier lifetime $\tau_1$ is again set to be uniformly or homogeneously low in the entire volume or bulk of the semiconductor wafer. Then, in the partial region B' extending from below the auxiliary emitter zone 12, or at least the edge of the auxiliary emitter contact K' facing the emitter zone 11, to the pn-junction $J_3$ between the zones 11 and in particular, the portion of the pn-junction $J_3$ forming the edge 111 of zone 11 facing the zone 12 but without contacting the zone edge 111, the charge carrier lifetime $\tau_3$ is set, by means of electron irradiation in the form of a bundle of rays $\epsilon'$ directed orthogonally onto the major surface portion H', to be substantially lower than the charge carrier lifetime $\tau_1$. Likewise, in the partial region B extending from below the control electrode G to the pn-junction between zones 12 and 13, and in particular the portion of the pn-junction forming the edge 121 of zone 12 facing the electrode G, but without contacting the zone edge 121, the charge carrier lifetime $\tau_2$ is set, by means of electron irradiation in the form of a bundle of rays $\epsilon$ directed orthogonally onto the major surface portion H, to be less than the bulk charge carrier lifetime $\tau_1$ but higher than the charge carrier lifetime $\tau_3$ of the partial region B', so that $\tau_1 > \tau_2 > \tau_2$.

In the auxiliary emitter zone 12, the shorting channels 123 in the edge region 124 are arranged so closely together that the thyristor will not be fired upon a rise dV/dt of the returning forward voltage. However, if the shorting channels 123 in the edge region 124 of auxiliary emitter zone 12 are arranged very close together, the control or firing current, respectively, required for firing may become undesirably high even in a thyristor 1' according to FIG. 2. This can be avoided, however, by a special configuration of the control electrode-auxiliary emitter system including auxiliary cathode K'. In particular, and according to FIG. 3, the circular control electrode G is provided with an extension G' which causes the control current flowing from the control electrode G to the auxiliary emitter zone 12 to be concentrated in a preferred portion of the edge 121 of the auxiliary emitter zone 12 so that the firing current requirement is reduced. This measure has the result that the control current is relatively small (a few 100 mA) and flows for only a short time so that no thermal overloads of significance will occur and thus there is no danger of destruction. With this configuration of the control electrode G according to FIG. 3, the control electrode-auxiliary emitter system (G,12) can be fired more easily without the need to impress a high control current.

Even without a special design for the control electrode G, a thyristor of the so-called amplifying gate type according to FIG. 2 with the bulk charge carrier lifetime set homogeneously and with the charge carrier lifetime in the partial regions B and B' according to the unequality $\tau_1 > \tau_2 > \tau_3$ is designed in such a way that the firing process is inhibited more strongly in the region of the edge 111 of the emitter zone 11 than in the region of the edge 121 of the auxiliary emitter zone 12. Accordingly, as a result of the greater shorting density of the auxiliary emitter zone 12, the firing current requirement as well as the turn-on losses are greater in the auxiliary emitter zone 12 than in the emitter zone 11.

In a thyristor according to FIG. 1 and FIG. 2 bulk charge carrier lifetime $\tau_1$ will be numerically set to be at a time value in terms of the turn-off time $t_q$ which can be chosen in a scope extending from 10 μs up to 100 μs. By rule of practice (see to Proc IEEE/IAS International Semiconductor Power Converter Conference, Orlando, 1977, p. 11), lifetime $\tau_1$ is to be set at a time value which is one tenth to one seventh of chosen $t_q$. For example, if $t_q = 28$ μs is provided for the thyristor, $\tau_1$ should be set at a time value between 2.8 μs and 4 μs.

Moreover, the charge carrier lifetime $\tau_2$ in the partial region B of a thyristor element of the embodiment of FIG. 1 or 2 should be at least 30 percent less than the bulk charge carrier lifetime $\tau_1$.

By still a higher percentage of at least 50%, the charge carrier lifetime $\tau_3$ in the partial region B' of a thyristor element of the embodiment of FIG. 2 should be less than the bulk charge carrier lifetime $\tau_1$. A thyristor element of the type as shown in FIGS. 1 and 2 is a completed monocrystalline wafer of silicon which could have a diameter of 1 inch to 3 inch and a thickness of about 200 mils to 300 mils respectively. The formation of a typical zone structure in the wafer, one main n-emitter zone, one auxiliary n-emitter zone and the control p-base zone being most relevant to the invention, is caused by diffusion operations. The main emitter zone 11 and auxiliary emitter zone 12 formed in the control base zone 13 both extend in thickness 12 mils to about 14 mils into the wafer from the major surface 16. The control base zone 13 is about 26 mils thick. After the diffusion operations, the impurity concentration of the control base zone 13 is, at the major surface of the wafer, 4 to $6 \cdot 10^{18}$ p-dopant atoms per cubic centimeter. The impurity concentration of the emitter zone according to FIG. 1 and the auxiliary emitter zone according to FIG. 2 at the major surface of the wafer is in the order of $10^{21}$ n-dopant atoms per cubic centimeters.

The process of making thyristor elements, as shown in FIGS. 1 and 2, is started with a monocrystalline n-type silicon wafer having a resistivity of 100 ohm centimeters. After preparation of that wafer, two operations are applied to it, i.e. a gallium diffusion followed by a diffusion of phosphorus, the wafer having been suitably masked for the diffusion of phosphorus after the gallium diffusion. The process of making a thyristor element having an amplifying gate, as shown in FIG. 2, is different from that of making a thyristor element according to FIG. 1 only by the masking of the wafer for the n-emitter zones 11 and 12, before phorphorus is diffused into it. Following this diffusion operation, the mask is removed and, after removal of the mask, a thin layer of gold is deposited on the major surface of the wafer. For example, an acid solution of hexachloroauric acid is applied to deposit the gold layer. Then, in a chamber or oven the wafer is heated for tempering the same to a suitable high temperature between 790° C. and 830° C. in hydrogen gas for about one hour time. Under the conditions as specified hereinbefore, gold atoms will be diffused into the wafer. Diffusion temperature and time are adequately controlled so that the diffusion will penetrate the control base zone 13 and part of n-base zone 14. By controlling the diffusion temperature at 815° C., the bulk charge carrier lifetime $\tau_1$ in the base zones will be set at about 5 $\mu$s.

Following this specific operation step, and after the remaining gold layer has been removed and the electrodes G, K and K' have been applied on the major surface of the wafer, the electron irradiation process is to be performed. To proceed in this way, a mask of molybdenium with openings which leave the portions H and H' of the major surface-exposed is applied upon the major surface 16. Then, the electron irradiation process is expediently performed in two succeeding steps, first on to the region B' through the portion H' and second on to region B through the portion H of the major surface. To perform these steps, an appropriate electron irradiator apparatus is used. In either step a bundle of 2.5 MeV electron rays in air is directed orthogonally onto the major surface portions H' and H respectively. In the first step a bundle having a dose of $1.2 \cdot 10^{14}$ electrons per square centimeter is directed onto portion H' only, while the opening for the portion H of the mask is hold closed. In the second step a bundle having a dosage of $2.8 \cdot 10^{14}$ electrons per square cm is then directed onto both surface portions H and H', so that in the region B' through portion H' the charge carrier lifetime $\tau_3$ is set at a time value of about 2 $\mu$s by the additional electron irradiation having a dosage of $2.8 \cdot 10^{14}$ electrons per square centimeter (that is effected by a total dosage of $4 \cdot 10^{14}$ electrons per square cm) and that in the region B through portion H the charge carrier lifetime $\tau_2$ is set at a time value of about 2.9 $\mu$s by an electron irradiation with a dosage of $2.8 \cdot 10^{14}$ electrons per square centimeters only.

It will be understood that the above description of the present invention is susceptible to various modifications, changes and adaptations, and the same are intended to be comprehended within the meaning and range of equivalents of the appended claims.

What is claimed is:

1. In a fast switching thyristor in which, in order to shorten the turn-off time, the charge carrier lifetime is set to be low by means of recombination centers, said thyristor including a semiconductor wafer having four zones of alternating opposite conductivity type including a control base zone which extends to one major surface of said wafer and an emitter zone which is formed within said control base zone adjacent said one major surface and which is penetrated by shorting channels emanating from said control base zone, an emitter electrode on said one major surface contacting said shorted emitter zone, and a control electrode on said one major surface contacting said control base zone; and wherein the charge carrier lifetime in said control base zone of said thyristor is set to be homogeneous and low corresponding to a desired firing resistance underneath said emitter zone with respect to the voltage rise of the returning forward voltage in said thyristor after every recovery process; the improvement wherein: the charge carrier lifetime is set to be lower compared to said homogeneous setting in the partial region of said control base zone extending from below the edge of said control electrode substantially to the portion of the edge of said emitter zone which faces said control electrode but without contacting said edge of said emitter zone.

2. In a fast switching thyristor of the amplified gate type in which, in order to shorten the turn-off time, the charge carrier lifetime is set to be low by means of recombination centers, said thyristor including a semiconductor wafer having at least four zones of alternating opposite conductivity type including a control base zone which extends to one major surface of said wafer and main emitter and auxiliary emitter zones which are formed within said control base zone adjacent said one major surface and which are penetrated by shorting channels emanating from said control base zone, a main emitter electrode and an auxiliary emitter electrode on said one major surface contacting said shorted main emitter zone and said shorted auxiliary emitter zone, respectively, and a control electrode on said one major surface contacting said control base zone; and wherein the charge carrier lifetime in said control base zone of said thyristor is set to be homogeneous and low corresponding to a desired firing resistance underneath said emitter zones with respect to the voltage rise of the returning forward voltage in said thyristor after recovery process; the improvement wherein: the charge carrier lifetime is set to be lower compared to said homogeneous setting in a first partial region of said control base zone extending from below the edge of said control electrodes substantially to the portion of the edge of said auxiliary emitter zone which faces said control electrode but without contacting said edge of said auxiliary emitter zone; the charge carrier lifetime is set to be even lower than in said first partial region in a second partial region of said control base zone extending from beneath the adjacent edge of the auxiliary emitter electrode substantially to the portion of the edge of said main emitter zone which faces said auxiliary emitter zone; and said shorting channels of said auxiliary emitter zone in the region thereof adjacent the edge of said auxiliary emitter zone which faces said control electrode are closer together than in the remaining region of said auxiliary emitter zone, and are closer together than said shorting channels in said main emitter zone.

3. A thyristor as defined in claim 1 wherein said partial region of said control base zone of said thyristor extends up to a distance of from 0.5 mm to 0.3 mm from said edge of said main emitter zone.

4. A thyristor as defined in claim 2 wherein said first and second partial regions of said control base zone of said thyristor extend up to a distance of from 0.05 mm to 0.3 mm from said edge of said auxiliary emitter zone and from said edge of said main emitter zone, respectively.

5. A thyristor as defined in claim 3 or claim 4 wherein said partial regions of said control base zones extend to 0.1 mm from said edge of the associated one of said emitter zones.

6. A thyristor as defined in claim 1 or claim 2 wherein said control electrode is centrally disposed on said one major surface of said semiconductor body.

* * * * *